United States Patent
Spreitzer et al.

(10) Patent No.: US 7,820,077 B2
(45) Date of Patent: Oct. 26, 2010

(54) SOLUTIONS OF ORGANIC SEMICONDUCTORS

(75) Inventors: Hubert Spreitzer, Viernheim (DE); Andreas Sauer, Glashütten (DE); Carsten Schwan, Selters-Eisenbach (DE); Neil Tallant, Manchester (GB)

(73) Assignee: Merck Patent GmbH, Darmstadt (DE)

( * ) Notice: Subject to any disclaimer, the term of this patent is extended or adjusted under 35 U.S.C. 154(b) by 1108 days.

(21) Appl. No.: 10/589,162

(22) PCT Filed: Feb. 17, 2005

(86) PCT No.: PCT/EP2005/001596

§ 371 (c)(1), (2), (4) Date: Aug. 10, 2006

(87) PCT Pub. No.: WO2005/083814

PCT Pub. Date: Sep. 9, 2005

(65) Prior Publication Data

US 2007/0173578 A1  Jul. 26, 2007

(30) Foreign Application Priority Data

Feb. 18, 2004  (DE) .................. 10 2004 007 777

(51) Int. Cl.
*H01B 1/12* (2006.01)
*H01L 35/24* (2006.01)
*H01J 1/62* (2006.01)
*B05D 5/06* (2006.01)

(52) U.S. Cl. ............... 252/500; 257/40; 313/504; 427/66

(58) Field of Classification Search ........... 252/500; 313/504; 257/40; 427/66
See application file for complete search history.

(56) References Cited

U.S. PATENT DOCUMENTS

| 5,091,004 | A | | 2/1992 | Tabayashi et al. |
| 5,232,631 | A | * | 8/1993 | Cao et al. ............... 252/500 |
| 6,963,080 | B2 | * | 11/2005 | Afzali-Ardakani et al. .... 257/40 |
| 6,994,893 | B2 | | 2/2006 | Spreitzer et al. |
| 2003/0127977 | A1 | | 7/2003 | Bae et al. |

(Continued)

FOREIGN PATENT DOCUMENTS

EP  0 610 929  8/1994

(Continued)

OTHER PUBLICATIONS

T.R. Hebner et al., "Ink-Jet printing of doped polymers for organic light emitting devices," *Applied Physics Letters*, vol. 72, No. 5, pp. 519-521 (Feb. 2, 1998).

*Primary Examiner*—Mark Kopec
*Assistant Examiner*—Jaison P Thomas
(74) *Attorney, Agent, or Firm*—Connolly Bove Lodge & Hutz LLP

(57) ABSTRACT

The invention relates to solutions of at least one organic semiconductor containing at least one high-molecular constituent, in a solvent mixture of at least three different organic solvents A, B and C. The invention is characterized in that the solvents A and B are good solvents for the organic semiconductor, the solvent C is a bad solvent for the organic semiconductor, and Sdp.(A)<Sdp.(C)<Sdp.(B) holds good for the boiling points (Sdp.) of the solvents. The invention also relates to the use of said solutions in printing methods for producing layers of the organic semiconductor on substrates, especially in the electronics industry.

24 Claims, 1 Drawing Sheet

Printed pixels

U.S. PATENT DOCUMENTS

| | | | |
|---|---|---|---|
| 2004/0038459 A1* | 2/2004 | Brown et al. | 438/142 |
| 2004/0225056 A1* | 11/2004 | Spreitzer et al. | 524/570 |
| 2005/0014023 A1* | 1/2005 | Yu et al. | 428/690 |
| 2007/0205400 A1* | 9/2007 | Kato et al. | 252/500 |

FOREIGN PATENT DOCUMENTS

| | | | |
|---|---|---|---|
| JP | 4-180977 | | 6/1992 |
| WO | WO 02/45184 | * | 6/2002 |
| WO | WO-02/069119 | | 9/2002 |
| WO | WO-02/072714 | | 9/2002 |

* cited by examiner

Figure 1: Printed pixels
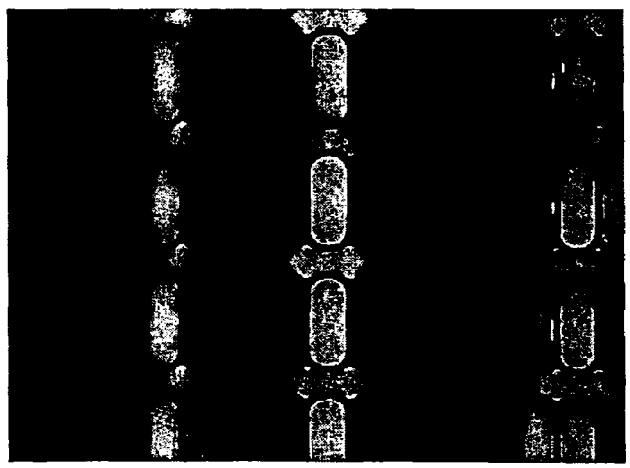
Figure 2: Height profile in a pixel (measured by PL intensity). X axis in μm.
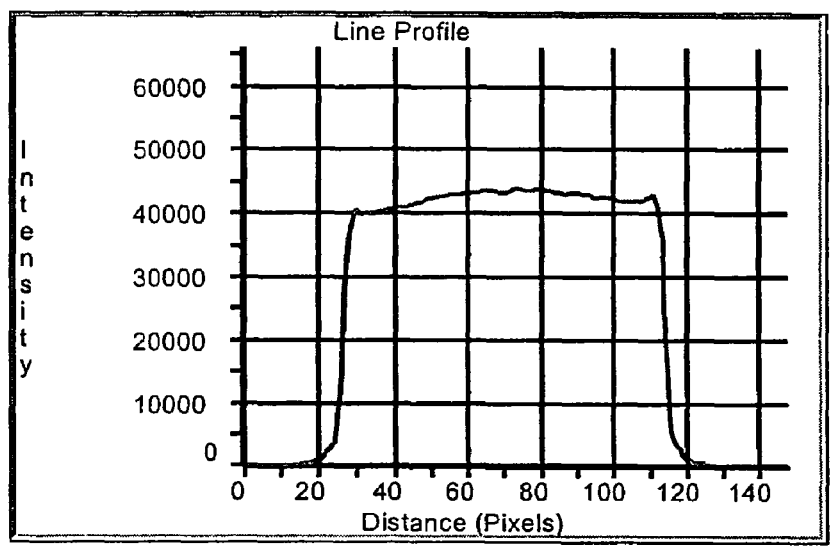

SOLUTIONS OF ORGANIC SEMICONDUCTORS

This application is a national stage application (under 35 U.S.C. 371) of PCT/EP2005/001596 filed Feb. 17, 2005, which claims benefit to German application 10 2004 007 777.0 filed Feb. 18, 2004.

The present invention relates to solutions of organic semiconductors, and to the use thereof in the electronics industry.

The use of organic semiconductors as functional materials has been reality for some time or is expected in the near future in a number of different applications which can be ascribed to the electronics industry in the broadest sense. Thus, organic charge-transport materials (generally hole transporters based on triarylamine) have already been used for many years in photocopiers. The development of organic transistors (O-TFTs, O-FETs), organic integrated circuits (O-ICs) and organic solar cells (O-SCs) is already very well advanced at the research stage, so that market introduction can be expected in the next few years. In the case of organic electroluminescent devices (OLEDs), the market introduction has already taken place, as confirmed, for example, by the car radios from Pioneer or a digital camera from Kodak with an "organic display". A first product is also available on the market in the case of polymeric light-emitting diodes (PLEDs) in the form of a small display in a shaver from Philips N. V. The general structure of such PLEDs is shown in WO 90/13148. In spite of all advances, significant improvements are still necessary in order to make these displays a true competitor to or to surpass the liquid-crystal displays (LCDs) which currently dominate the market.

In order to obtain full-colour display devices, it is necessary to develop coating methods which allow the three primary colours (red, green, blue) to be applied in a spatially separated manner. Since the polymers are generally applied from solution, printing methods are the means of choice here. Owing to the good controllability, the achievable resolution and the large variability, it is principally ink-jet printing (IJP) methods that are currently being worked on. In principle, however, other printing methods, such as for example, offset printing, transfer printing or gravure printing methods, are also suitable.

The ink-jet method for the production of PLEDs and corresponding displays has already been described a number of times:

EP 0880303 to this specification, a solution of an organic luminescent material is applied by IJP to a photolithographically prepared substrate with partitioning and anode. The use of different solution enables differently coloured pixels (picture elements) to be produced. This application concentrates more on describing the principle, but less on giving a technical teaching which indicates the practical procedure and the problems to be solved in the process. Thus, apart from three rather object-directed formulations, there is not teaching regarding the consistency and preparation of the corresponding solutions. It is only formulated that the solutions had to have a contact angel of between 30 and 170° to the material of the nozzle plate of the IJ print head. Furthermore, the viscosity of the solution should be between 1 and 20 mPa·s (cps) and the surface tension should be between 20 and 70 dyn/cm.

These details do not technically represent a relevant assistance or teaching since the broad contact angle exists in practice for virtually all solutions or solvents provided only that the nozzle plate is correspondingly prepared. The viscosity range indicated likewise already commences with virtually pure solvent (for comparison: pure toluene has about 0.6 mPa·s, tetralin, by contrast, already about 2 mPa·s) and extends, depending on the molecular weight of the organic compound employed, as far as very high concentrations. Finally, the surface-tension range indicated also does not give a true restriction: most organic solvents which can be used have values in the state range; these values do not change significantly due to dissolution of polymers.

However, the production of organic films or pixels by IJP exhibits a number of problems which have not yet been solved satisfactorily and which also remain unconsidered in the above-mentioned application:

Problem 1: Solvents having an excessively high vapour pressure, i.e. having an excessively low boiling point, result in the IJ solutions drying in the print head, on the nozzle or on the nozzle plate. This has the consequence that the nozzle can be come blocked and the printing process becomes difficult to reproduce. A system of this type is unsuitable for industrial manufacture.

Problem 2: If the IJ solution comprises different materials (blends), it may occur during drying of the solution that the one of these substance precipitates first. This results in an inhomogeneous distribution of the various material in the pixel formed. Pixels which are inhomogeneous in this way exhibit a significant impairment of the device properties in the OLED.

Problem 3: During drying of the individual drops of the IJ solutions of the substrate, it may occur that the layer thickness of the pixel formed varies greatly. In general, the edges of the pixel are significantly higher than the centre of the pixel. This results in an inhomogeneous luminous intensity within the pixel in the PLED and also in different degradation of the various regions of the pixel.

Problem 4: If the solution dries too slowly in the printed-on pixels or if the viscosity changes only relatively little during the drying process, it may occur during movement of the substrate (in industrial IJP, the substrate is generally conveyed in one direction, the print head moves perpendicular thereto) that solution flows over the pixel boundary (the pixels are generally delimited by photolithographically produced walls). A mixture of the inks is harmful, in particular, if this causes solutions of different colour to mix. The undesired layer-thickness variations and resultant inhomogeneities always result in unreproducible emission behaviour.

Problem 5: It is necessary to remove the solvent as completely as possible from the deposited film in order to obtain optimum device properties. If the solvent has an excessively low vapour pressure (i.e. and excessively high boiling point), this is only possible, if at all, with considerable technical complexity.

Problem 6: If the solution in the printed-on pixels dries to quickly, there is a risk that the organic semiconductor will precipitate from the solution. This generally results in inhomogeneities of the film formed and thus in inhomogeneities in eth electroluminescence.

In order to solve the above problem 1, it is proposed in WO 00/59267 to use substituted benzene derivatives having at least 3 C atoms in the substituent(s) as solvent. Preference is given here to solvents whose boiling point is at least 200° C. However, the solvent dodecylbenzene taught as particularly preferred has a boiling point of about 300° C. Furthermore, a mixture of at least two solvents is propose, where the first has the above-mentioned properties and the second may also have a lower boiling point, but this is again as least 140° C. However, this aspect is unclear since solvents which have significantly lower boiling point, such as, for example, toluene (b.p. 111° C.), chloroform (b.p. 61° V.) and carbon tetrachloride (b.p. 76° C.), are also mentioned here.

These solutions are intended to provide the following problem solutions: firstly, the high-boiling solvent prevents the solution from drying in the print head (solution to problem 1). In order to homogenize the pixel (solution to problem 2) and in particular in order to remove the high-boiling solvent, which is difficult to remove, and after-treatment is proposed. Here, the pixel is heated to temperatures between 40 and 200° C. This is initially carried out under an excess pressure of 2 to 100 bar in order again to produce a homogeneous solution. Conditioning is subsequently continued under reduced pressure until all the solvent has been removed.

The solution proposal in accordance with WO 00/59267 has severe technical problems: the complete removal of the solvent is essential for good device properties, but is very complex in an industrial process, especially in the case of the preferred high-boiling solvents (for example dodecylbenzene, b.p.≈300° C.), and is very difficult to achieve. The outlined measures for homogenization (high pressure, conditioning, vacuum) are not very suitable for industrial mass production—owing to plant-technical and financial problems. Some of the said admixed solvents (for example chloroform, carbon tetrachloride) are toxic or are even suspected of having carcinogenic properties and should therefore be avoided.

EP 1103590 describes solutions for the production of an organic layer in electroluminescent devices by printing methods, where at least one solvent has a vapour pressure of less than 500 Pa at the application temperature. This enables the layers to be printed better than is the case with solvent having a higher vapour pressure. The only printing methods described in the text here are methods in which the coating liquid is transferred to a transfer substrate and form there to the substrate. This excludes ink-jet printing methods. It is also not evident from the application whether or in which preferred embodiment a solution of this type could be used for IJP in order to overcome the problems described above.

WO 01/16251 describes formulations for the production of polymer layers in electroluminescent devices, where the solvent comprises at last either a terpene or a polyalkylated aromatic compound. It is described as advantageous that the solutions as such exhibit high stabilities with virtually unchanged photoluminescence behaviour. Properties of these formulations during the printing process or during film formation itself are not described, and it must consequently be assumed that the problems described above are not solved by this invention.

WO 02/069119 describes how the inhomogeneous distribution of the material within the dried drip can be improved (solution to problem 3). For this purpose, a mixture of two solvents is used, where the first has a relatively high boiling point and dissolves the material relatively poorly and the second has a relatively low boiling point and dissolves the material relatively well. The rapid evaporation of the more volatile solvent causes the formation during drying of a saturated solution of the material, which subsequently precipitates rapidly. This prevents radial flow of the material towards the edges of the pixel and facilitates a relatively uniform material distribution. However, this method exhibits the crucial disadvantage that the material does not dry uniformly, but instead that a precipitate forms, which results in significant inhomogeneities of the film. US 2003/0127977 shows, for example by SEM (scanning electron microscopy), that the film exhibits poor properties if the material precipitates during drying. As a result, uniform and homogeneous electroluminescence from the pixel is not possible. Furthermore, the irregularity of the film means that a uniform current flow is not possible. It must be assumed that this results in the formation of preferred current channels, which then ultimately result in short circuits and thus significantly lower stability of the device.

WO 02/072714 proposes solution in a mixture of two (or also three) solvents, where both solvents have a boiling point of less than 200° C. and one solvent has a boiling point of between 140° C. and 200° C., which furthermore contain no benzylic $CH_2$ and CH groups and which have certain restrictions for the substituents on aromatic solvents. Thus, solvent residues can be removed from the polymer film more easily than is possible with high-boiling solvents. It is described as particularly favourable if the solution thickens quickly. This is achieved by using binary or ternary solvent mixtures in which the organic semiconductor has the lowest solubility in the solvent having the highest boiling point or is very thick or gelatinous in this solvent. A rapid increase in viscosity then occurs during thickening without the material precipitating. Very good advances have already been achieved thereby; however, further improvements are still necessary for the formation of completely homogeneous layers and in order to overcome problem 3 or 6 completely, and it would be desirable to have available solutions which thicken even more quickly during drying.

US 2003/0127977 describes solutions in a solvent which has a surface tension of less than 30 dyn/cm and a boiling point of greater than 200° C. Also described are ternary solvent systems, where the polymer has a solubility of greater than 1% in one solvent, the second solvent has an evaporation rate of less than 0.1, and the third solvent has a surface tension of less than 30 dyn/cm. This gives uniform polymer surfaces which no longer exhibit any inhomogeneities in the SEM (scanning electron microscopy) picture. By comparison, inhomogeneous surfaces, which result in problems in electroluminescence, are obtained if the polymer precipitates out of the solution during the drying process. However, it is not described in this application how the other problems described above, in particular the different material distribution between pixel centre and edge (problem 3), can be overcome by this invention.

It is clear from these descriptions that problems 1 to 6 described above have hitherto not been solved satisfactorily. The object of the present invention is therefore to offer a technical improvement for this.

BRIEF DESCRIPTION OF THE DRAWINGS

FIG. 1 shows the photography of structured pixels under UV-irradiation (356 nm). The pixels are obtained via InkJet printing in that inventive solution 6 was printed into a structured substrate.

FIG. 2 shows the height profile of such a printed pixel. The height profile is measured in that the intensity of the photoluminescence (PL) is determined. The height profile shows the size of the pixel (given in micrometer on the X axis).

The invention relates to single-phase, liquid compositions (solutions) comprising
    at least one organic semiconductor which comprises at least one high-molecular-weigh component,
    and at least one organic solvent A,
    and at least one organic solvent B,
    and at least one organic solvent C, characterized in that
    solvent A is a good solvent for the organic semiconductor,
    solvent B is a good solvent for the organic semiconductor,
    solvent C is a poor solvent for the organic semiconductor and
    the following applies to the boiling points (b.p.) of solvents A, B and C: b.p.(A)<b.p.(C)<b.p.(B), and/or to the respective partial vapour pressures (p) at the temperature of the coating method of solvents A, B and C: p(A)>p(C)>p(B).

The temperature of the coating method in industrial processes is generally in the range from 10 to 80° C., preferably 15 to 50° C., in particular 20 to 40° C.

For the purposes of this application text, solutions are liquid, homogeneous mixtures of solid substances in liquid solvents in which the solids are in molecularly disperse dissolved form, i.e. the majority of the molecules of the solid are actually dissolved and are not in the form of aggregates or nano- or microparticles.

For the purposes of this invention, an organic solvent is intended to mean organic substances which are able to bring other substances into solution by physical means without the dissolving or dissolved substance changing chemically during the dissolution process.

For the purposes of this invention, a good solvent is intended to mean an organic solvent in which the organic semiconductor is soluble at a concentration of at least 5 g/l at room temperature and atmospheric pressure with formation of a clear flowable solution.

For the purposes of this invention, a poor solvent is intended to mean an organic solvent in which the organic semiconductor does not give a clear solution, i.e. in which it flocculates or forms a gel, at the above-mentioned concentration at room temperature and atmospheric pressure. The solubility of the organic semiconductor in the poor solvent at room temperature and atmospheric pressure is preferably less than 3 g/l, particularly preferably less than 1 g/l, especially less than 0.3 g/l.

For the purposes of the present invention, room temperature is 20° C. and atmospheric pressure means 1013 mbar.

The invention furthermore relates to the use of the solutions according to the invention for producing layers of the organic semiconductor on a substrate.

A preferred embodiment here is the use of printing methods for the production of the organic semiconductor layers. Particular preference is given here to the use of inkjet printing (IJP) methods.

The invention furthermore relates to layers of the organic semiconductors produced using the solutions according to the invention.

Layers of the organic semiconductors known per se have already been described in the literature. The layers produced from the solutions according to the invention exhibit improved morphological properties compared with those described to date (this is confirmed, inter alia, in Example 1.4). In particular, the constancy of the layer thickness over the coating area (for example the individual pixel), the homogeneity of the layer and the surface, even on use of blends or mixtures of organic semiconductors, and the freedom from so-called pinholes (microscopically small holes in the semiconductor layer, which can result in fatal device damage) is considerably improved by the improved applicational properties of the solutions according to the invention.

For the purposes of this application, organic semiconductors are taken to mean low-molecular-weight, oligomeric, dendritic or polymeric, organic or organometallic compounds or mixtures of compounds which, as solid or layer, have semiconducting properties, i.e. in which the energy gap between the conduction and valance bands is between 0.1 and 4 eV. The organic semiconductor used here is either a pure component, which then only comprises one high-molecular-weight component, or a mixture of two or more components, at least one of which must have semiconducting properties. In the case of the use of mixtures, however, it is not necessary for each of the components to have semiconducting properties. Thus, for example, inert low-molecular-weight compounds can be used in combination with semiconducting polymers. It is likewise possible to use non-conducting polymers, which server as inert matrix or binder, together with one or more low-molecular-weight compounds having semiconducting properties.

The high-molecular-weight component, which may be oligomeric, polymeric or dendritic, has a molecular weight $M_w$ of greater than 3000 g/mol, preferably of greater than 10,000 g/mol, particularly preferably of greater than 50,000 g/mol.

For the purpose of this application, the potentially admixed non-conducting component is taken to mean an electro-optically inactive, inert, passive compound.

Preference is given to solutions of polymeric organic semiconductors (which may comprise further admixed substances). For the purposes of the present description, polymeric organic semiconductors are taken to mean, in particular, (i) the substituted poly-p-arylenevinylenes (PAVs) disclosed in EP 0443861, WO 94,20589, WO 98/27136, EP 1025183, WO 99/24526, DE 19953806 and EP 0964045 which are soluble in organic solvents, (ii) the substituted polyfluorenes (PFs) disclosed in EP 0842208, WO 00/22027, WO 00/22026, DE 19981010, WO 00/46321, WO 99/54385 and WO 00/55927 which are soluble in organic solvents, (iii) the substituted polyspirobifluorenes (PSFs) disclosed in EP 0707020, WO 96/17036, WO 97/20877, WO 97/31048, WO 97/39045 and WO 03/020790 which are soluble in organic solvents, (iv) the substituted poly-para-phenylenes (PPPs) or -biphenylenes disclosed in WO 92/18552, WO 95/07955, EP 0690086, EP 0699699 and WO 03/099901 which are soluble in organic solvents, (v) the substituted polydihydrophenathrenes (PDHPs) disclosed in DE 10337346.2 which are soluble in organic solvents, (vi) the substituted poly-trans-indenofluorenes and poly-cis-indenofluorenes (PIFs) disclosed in WO 04/041901 and EP 03014042.0 which are soluble in organic solvents, (vii) the substituted polythiophenes (PTs) disclosed in EP 1028136 and WO 95/05937 which are soluble in organic solvents, (viii) the polypyridines (PPys) disclosed in T. Yamamoto et al., *J. Am. Chem. Soc.* 1994, 116, 4832 which are soluble in organic solvents, (ix) the polypyrroles disclosed in V. Gelling et. al., *Polym. Prepr.* 200, 41, 1770 which are soluble in organic solvents, (x) substituted, soluble copolymers which contain structural units from two or more of classes (i) to (ix), as described, for example, in WO 02/077060, (xi) the conjugated polymers disclosed in *Proc. of ICSM '98*, Part I & II (in *Synth. Met.* 1999, 101/102) which are soluble in organic solvents, substituted and unsubstituted polyvinylcarbazoles (PVKs), as disclosed, for example, in R. C. Penwell et al., *J. Polym. Sci. Marcromol. Rev.* 1978, 13, 63-160, and (xiii) substituted and unsubstituted triarylamine polymers, as disclosed, for example, in JP 2000072772, (xiv) soluble polymers containing phosphorescent units, as disclosed, for example, in EP 1245659, WO 03/001616, WO 03/018653, WO 03/022908, WO 03/080687, EP 1311138, WO 03/102109, WO 04/003105, WO 04/015025 and some of the specifications already cited above.

These polymeric organic semiconductors are incorporated into the present invention by way of reference.

Preference is furthermore also given to solutions of non-conducting polymers (matrix polymers) which comprise low-molecular-weight, oligomeric, dendritic or polymeric organic and/or organometallic semiconductors.

The solutions according to the invention comprise between 0.01 and 20% by weight, preferably between 0.1 and 15% by weight, particularly preferably between 0.2 and organic semiconductor or of the corresponding blend.

The viscosity of the solutions according to the invention is variable. However, certain coating techniques require use of certain viscosity ranges. Thus, a range from about 4 to 25 mPa·s should be given as appropriate for coating by IJP. For other printing methods, for example gravure printing methods, however, it is also entirely possible for a significantly higher viscosity, for example in the range from 20 to 500 mPa·s, to give rise to advantages. The viscosity can be adjusted through the choice of the suitable molecular-weight range of the organic semiconductor or matrix polymer and through the choice of the suitable concentration range and choice of the solvents. The surface tension of the solutions according to the invention is initially not restricted. Through the use of corresponding solvent mixtures and the application, however, this will generally be in the range from 20 to 60 dyn/cm, preferably in the range from 25 to 50, very particularly preferably in the range from 25 to 40 dyn/cm.

The solutions according to the invention comprise—as described above—at least three different organic solvents A, B and C, of which solvents A and B are good solvents for the organic semiconductor, solvent C is a poor solvent for the organic semiconductor, and where, in addition, the following applies to the boiling points (b.p.) of the solvents: b.p.(A)<b.p.(C)<b.p.(B), and the following applies to the respective vapour pressures (p) at the temperature of the coating method of solvents A, B and C: p(A)>p(C)>p(B).

It is preferred here for the boiling points of all solvents A, B and C to be greater than 80° C., preferably greater than 100° C., particularly preferably greater than 120° C. A further technical restriction which has already been achieved with this preference is avoidance of some solvents which are toxic or have been shown to be carcinogenic, which applies, for example, to chloroform (b.p. 61° C.), tetrachloromethane (b.p. 77° C.) and benzene (b.p. 80° C.).

At least one solvent B is preferably present which has a boiling point of greater than 140° C. This limit is technically appropriate as it has been shown that on use of solvents having a lower boiling point, the drying of the nozzles takes place within a few seconds after completion of the printing operation. As soon as this value is at least about 10 seconds, drying-out can be prevented by suitable technical measures (for example print head moves into the waiting position, nozzles are mechanically sealed with a cap).

The boiling points of all solvents A, B and C are furthermore preferably less than 300° C., preferably less than or equal to 270° C., particularly preferably less than or equal to 250° C. In the case of higher-boiling solvents, the residual solvent after film formation can only be removed completely with difficulty and with considerable technical complexity.

In this application text, boiling point refers to the boiling point under atmospheric pressure (1013 mbar).

The melting point of all solvents A, B and C is preferably less than or equal to 15° C. Such a melting point is appropriate since the solutions under certain circumstances (between preparation and use) have to be stored or possibly also transported for days to months. It must be ensured here that the solutions also remain stable as such and do not freeze during storage, transport and/or relatively small temperature variations or suffer other disadvantageous storage and/or transport damage.

It is furthermore preferred for the difference between the boiling points of solvent A and solvent C to be greater than 5 K, preferably greater than 10 K, particularly preferably greater than 20 K. It may furthermore be preferred for the difference between the boiling points of solvent C and solvent B to be greater than 5 K, preferably greater than 10 K.

The ratio of solvents A, B and C to one another can be varied in broad ranges. However, in order to achieve the best effects, solvent A should be used in a proportion of 10 to 80% by vol., preferably 20 to 70% by vol., particularly preferably 25 to 60% by vol., especially 25 to 50% by vol. Furthermore, solvent B should be used in a proportion of 0.5 to 40% by vol., preferably 1 to 30% by vol., particularly preferably 2 to 20% by vol., especially 3 to 15% by vol. Furthermore, solvent C should be used in a proportion of 10 to 90% by vol., preferably 20 to 80% by vol., in particular 30 to 70% by vol. The total percentage of the proportions of the respective solvent mixture always adds up to 100% here.

It may also be appropriate to use other good and/or poor solvents in addition to solvents A, B and C. Thus, it may be entirely appropriate and preferred in each case to use two or more solvents of type A and/or type B and/or type C since the optimization with respect to further necessary parameters (for example adaptation of the surface tension, the viscosity, etc,) may thereby in some cases be simpler to achieve compared with the case where only precisely one solvent of each type is used.

Furthermore it may also be appropriate to add further additives, as described, for example, in WO 03/19693, in addition to the organic semiconductor or blend.

The use of, for example, aldehyde-containing solvents, nitrated aromatics and phosphorus-containing solvents (poor stability of the solutions) and of styrene derivatives or other reactive olefins (polymerization tendency of the solvents) has proven disadvantageous.

Preferred solvents A and B which have proven to be good solvents for a wide range or organic semiconductors are mono- or polysubstituted aromatic solvents, in particular substituted benzenes, naphthalenes, biphenyls and pyridines. Preferred substituents are alkyl groups, which may also be fluorinated, halogen atoms, preferably chlorine and fluorine, cyano groups, alkoxy groups, dialkylamino groups, preferably those having not more than 4 C atoms, or ester groups. Particularly preferred substituents are fluorine, chlorine, cyano, methoxy, ethoxy, methyl, trifluoromethyl, methyl carboxylate, ethyl carboxylate and/or propyl carboxylate, where a plurality of different substituents may also be present. However, non-aromatic solvents, such as, for example, formic acid derivatives, N-alkylpyrrolidones or high-boiling ethers, are also suitable as good solvents.

Particularly preferred solvents A and/or B are the solvents having a boiling point of between 100 and 300° C. shown in Table 1 below.

In addition, the vapour pressures in the particularly preferred temperature range of coating methods are also included for some of the solvents mentioned. However, particularly suitable solvents must be determined separately for each organic semiconductor, and consequently this table can only give a general point of reference.

TABLE 1

| Solvent | CAS number | Boiling point [° C.] | Melting point [° C.] | Vapour pressure at 20° C. [torr] | Vapour pressure at 40° C. [torr] |
|---|---|---|---|---|---|
| 3-Fluorobenzotrifluoride | 401-80-9 | 102 | −81 | | |
| Benzotrifluoride | 98-08-8 | 102 | −29 | | |
| Dioxane | 123-91-1 | 102 | 12 | | |
| Trifluoromethoxybenzene | 456-55-3 | 102 | −50 | | |
| 4-Fluorobenzotrifluoride | 402-44-8 | 103 | −41 | | |
| 3-Fluoropyridine | 372-47-4 | 108 | n.s. | | |
| Toluene | 108-88-3 | 111 | −93 | 10.5 | 56.0 |
| 2-Fluorotoluene | 95-52-3 | 113 | −62 | | |
| 2-Methylthiophene | 554-14-3 | 113 | −63 | | |
| 2-Fluorobenzotrifluoride | 392-85-8 | 115 | −51 | | |
| 3-Fluorotoluene | 352-70-5 | 115 | −87 | | |
| Pyridine | 110-86-1 | 115 | −42 | | |
| 4-Fluorotoluene | 352-32-9 | 116 | −56 | | |
| 2,5-Difluorotoluene | 452-67-5 | 120 | −35 | | |
| 1-Chloro-2,4-Difluorobenzene | 1435-44-5 | 127 | −26 | | |
| 2-Fluoropyridine | 372-48-5 | 127 | n.s. | | |
| 3-Chlorofluorobenzene | 625-98-9 | 127 | n.s. | | |
| 1-Chloro-2,5-difluorobenzene | 2367-91-1 | 128 | −25 | | |
| 4-Chlorofluorobenzene | 352-33-0 | 130 | −27 | | |
| Chlorobenzene | 108-90-7 | 132 | −45 | | |
| 2-Chlorofluorobenzene | 348-51-6 | 138 | −42 | | |
| p-Xylene | 106-42-3 | 138 | 12 | | |
| m-Xylene | 108-38-3 | 139 | −47 | | |
| o-Xylene | 95-47-6 | 144 | −24 | 1.8 | 13.3 |
| 2,6-Lutidine | 108-48-5 | 145 | −6 | | |
| 2-Fluoro-m-xylene | 443-88-9 | 147 | n.s. | | |
| 3-Fluoro-o-xylene | 443-82-3 | 150 | n.s. | | |
| 2-Chlorobenzotrifluoride | 88-16-4 | 152 | −7 | | |
| Dimethylformamide | 68-12-2 | 153 | −61 | | |
| 2-Chloro-6-fluorotoluene | 443-83-4 | 154 | −27 | | |
| 2-Fluoroanisole | 321-28-8 | 154 | −39 | | |
| Anisole | 100-66-3 | 154 | −37 | 0.82 | 7.0 |
| 2,3-Dimethylpyrazine | 5910-89-4 | 156 | n.s. | | |
| Bromobenzene | 106-86-1 | 156 | −31 | | |
| 4-Fluoroanisole | 459-60-9 | 157 | −45 | | |
| 3-Fluoroanisole | 456-49-5 | 160 | −35 | | |
| 3-Trifluoromethylanisole | 454-80-0 | 160 | −65 | | |
| 2-Methylanisole | 578-58-5 | 170 | −34 | | |
| Phenetol | 103-73-1 | 170 | −30 | 0.27 | 3.1 |
| 1,3-Benzodioxole | 274-09-9 | 173 | −18 | | |
| 4-Methylanisole | 104-93-8 | 174 | −32 | 0.30 | 3.0 |
| 3-Methylanisole | 100-84-5 | 175 | −55 | | |
| 4-Fluoro-3-methylanisole | 2338-54-7 | 175 | n.s. | | |
| 1,2-Dichlorobenzene | 95-50-1 | 180 | −17 | | |
| 2-Fluorobenzonitrile | 394-47-8 | ~180 | n.s. | | |
| 4-Fluoroveratrol | 398-62-9 | ~180 | n.s. | | |
| 2,6-Dimethylanisole | 1004-66-6 | 182 | n.s. | | |
| Aniline | 62-53-3 | 184 | −6 | | |
| 3-Fluorobenzonitrile | 403-54-3 | 185 | −16 | | |
| 2,5-Dimethylanisole | 1706-11-2 | 190 | ~5 | | |
| 2,4-Dimethylanisole | 6738-23-4 | 191 | n.s. | | |
| Benzonitrile | 100-47-0 | 191 | −13 | | |
| 3,5-Dimethylanisole | 874-63-5 | 193 | n.s. | | |
| N,N-Dimethylaniline | 121-69-7 | 194 | 2 | | |
| 1-Fluoro-3,5-dimethoxybenzene | 52189-63-6 | ~195 | n.s. | | |
| Phenyl acetate | 122-79-2 | 196 | −30 | 0.025 | 0.59 |
| N-Methylaniline | 100-61-8 | 196 | −57 | | |
| Methyl benzoate | 93-58-3 | 198 | −12 | 0.084 | 0.89 |
| N-Methylpyrrolidone | 872-50-4 | 199 | −24 | | |
| 3,4-Dimethylanisole | 4685-47-6 | 200 | n.s. | | |
| o-Tolunitrile | 529-19-1 | 205 | −13 | | |
| Veratrol | 91-16-7 | 207 | 15 | 0.012 | 0.273 |
| Ethyl benzoate | 93-89-0 | 212 | −34 | 0.022 | 0.348 |
| N,N-Diethylaniline | 91-66-7 | 217 | −38 | | |
| 4-tert-Butylanisole | 5396-38-3 | 222 | n.s. | 0.013 | 0.259 |
| Propyl benzoate | 2315-68-6 | 231 | −51 | 0.006 | 0.131 |
| 1-Methylnaphthalene | 90-12-0 | 243 | −22 | 0.004 | 0.092 |
| 3,5-Dimethoxytoluene | 4179-19-5 | 244 | n.s. | | |
| Butyl benzoate | 136-60-7 | 250 | −22 | 0.0004 | 0.018 |
| 2-Methylbiphenyl | 643-58-3 | 255 | n.s. | | |
| Dimethylnaphthalene (isomer mixture) | 28804-88-8 | 262 | n.s. | | |

TABLE 1-continued

Particularly preferred good solvents A and B

| Solvent | CAS number | Boiling point [° C.] | Melting point [° C.] | Vapour pressure at 20° C. [torr] | Vapour pressure at 40° C. [torr] |
|---|---|---|---|---|---|
| 2-Phenylpyridine | 1008-89-5 | ~270 | n.s. | | |
| 2,2'-Bitolyl | 605-39-0 | ~300 | n.s. | | |

The solvents listed in Table 1 cannot make any claim to completeness. The preparation of a solution according to the invention is also readily possible for the person skilled in the art without inventive step with other solvents not mentioned explicitly here.

Preference is thus given to solutions according to the invention comprising, as solvents A and B, one or more solvents selected from 3-fluorobenzotrifluoride, benzotrifluoride, dioxane, trifluoromethoxybenzene, 4-fluorobenzotrifluoride, 3-fluoropyridine, toluene, 2-fluorotoluene, 2-fluorobenzotrifluoride, 3-fluorotoluene, pyridine, 4-fluorotoluene, 2,5-difluorotoluene, 1- chloro-2,4-difluorobenzene, 2-fluoropyridine, 3-chlorofluorobenzene, 1-chloro-2,5-difluorobenzene, 4-chlorofluorobenzene, chlorobenzene, 2-chlorobenzene, p-xylene, m-xylene, o-xylene, 2,6-lutidine, 2-fluoro-m-xylene, 3-fluoro-o-xylene, 2-chlorobenzotrifluoride, dimethylformamide, 2-chloro-6fluoroanisole, 3-fluoroanisole, 3-trifluoromethylanisole, 2-methylanisole, phenetol, benzodioxole, 4-methylanisole, 3-methylanisole, 4-fluoro-3-methylanisole, 1,2-dichlorobenzene, 2-fluorobenzonitrile, 4-fluoroveratrol, 2,6-dimethylanisole, aniline, 3-fluorobenzonitrile, 2,5-dimethylanisole, 2,4-dimethylanisole, benzonitrile, 3,5-dimethylanisole, N,N-dimethylaniline, 1-fluoro-3,5-dimethoxybenzene, phenyl acetate, n-methylaniline, methyl benzoate, N-methylpyrrolidone, 3,4-dimethylanisole, o-tolunitrile, 4-tert-butylanisole, veratrol, ethyl benzoate, N,N-diethylaniline, propyl benzoate, 1-methylnaphthalene, 3,5-dimethoxytoluene, butyl benzoate, 2methylbiphenyl, dimethylnaphthalene, 2-phenylpyridine or 2,2'-bitolyl.

Preferred solvents C which have proven to be poor solvents for a wide range of organic or organometallic, oligomeric, polymeric or dendritic semiconductors are straight-chain, branched or cyclic higher alkanes, preferably having seven or more C atoms. Corresponding industrial distillation fractions may also be selected here. Terpenes, (cyclo)aliphatic alcohols, ketones, carboxylic acid esters or mono- or poly-substituted aromatic solvents, in particular substituted benzenes, naphthalenes and pyridines which are substituted by long alkyl or alkoxy substituents having 4 or more C atoms, are also suitable. Furthermore suitable are higher alcohols having more than 4 C atoms, glycols or also ethers thereof, such as, for example, diglyme or triglyme.

Particular preference is given to the solvents having a boiling point of between 100 and 250° C. listed in Table 2 below, where again the particularly suitably solvents for each organic semiconductor must be determined separately here, and consequently this table can again only be taken as a general point of reference. Analogously to Table 1, the vapour pressures in the particularly preferred temperature range of coating methods are also included for some of the solvents listed.

TABLE 2

Particularly preferred poor solvents C

| Solvent | CAS number | Boiling point [° C.] | Melting point [° C.] | Vapour pressure at 20° C. [torr] | Vapour pressure at 40° C. [torr] |
|---|---|---|---|---|---|
| Methylcyclohexane | 108-87-2 | 101 | −127 | | |
| 3-Pentanol | 584-02-1 | 116 | −8 | | |
| cis/trans-1,4-Dimethylcyclohexane | 589-90-2 | 120 | −87 | | |
| cis/trans-1,3-Dimethylcyclohexane | 591-21-9 | 121–124 | n.s. | | |
| Ethylene glycol monomethyl ether | 109-86-4 | 124 | −85 | | |
| cis/trans-1,2-Dimethylcyclohexane | 583-57-3 | 124 | n.s. | | |
| Octane | 111-65-9 | 126 | −57 | | |
| 2-Hexanol | 626-93-7 | 136 | n.s. | | |
| 1-Pentanol | 71-41-0 | 138 | −79 | | |
| 1,2,4-Trimethylcyclohexane | 2234-75-5 | 142 | n.s. | | |
| 4-Heptanone | 123-19-3 | 145 | −33 | | |
| 3-Heptanone | 106-35-4 | 148 | −39 | | |
| 2-Heptanone | 110-43-0 | 150 | −35 | | |
| Nonane | 111-84-2 | 151 | −51 | | |
| Cyclohexanone | 108-94-1 | 155 | −47 | | |
| 3-Heptanol | 589-82-2 | 156 | −70 | | |
| 1-Hexanol | 111-27-3 | 157 | −52 | | |
| 2-Heptanol | 543-49-7 | 161 | n.s. | | |
| Diglyme | 111-96-6 | 162 | −64 | | |
| Butyl butyrate | 109-21-7 | 165 | n.s. | 1.1 | 5.5 |
| tert-Butylbenzene | 98-06-6 | 169 | −58 | | |
| Decane | 124-18-5 | 174 | −30 | 1.2 | 5.5 |
| 1-Heptanol | 111-70-6 | 176 | −36 | | |
| 2-Octanol | 123-96-6 | 179 | −39 | 0.056 | 0.90 |

TABLE 2-continued

Particularly preferred poor solvents C

| Solvent | CAS number | Boiling point [° C.] | Melting point [° C.] | Vapour pressure at 20° C. [torr] | Vapour pressure at 40° C. [torr] |
|---|---|---|---|---|---|
| Butylcyclohexane | 1678-93-9 | 180 | −78 | | |
| 2-Ethyl-1-hexanol | 104-76-7 | 185 | −76 | 0.016 | 0.42 |
| Decalin | 91-17-8 | 187 | −31 | 0.18 | 2.2 |
| Propylene glycol | 57-55-6 | 187 | −60 | | |
| Dimethyl sulfoxide | 867-68-5 | 189 | 19 | 0.66 | 3.1 |
| 3,3,5-Trimethylcyclohexanone | 873-94-9 | 190 | −10 | | |
| Glycol | 107-21-1 | 198 | −13 | | |
| 3,7-Dimethyl-1-octanol | 106-21-8 | about 200 | n.s. | 0.013 | 0.24 |
| 3,7-Dimethyl-3-octanol | 78-69-3 | about 200 | n.s. | | |
| Dimethyl succinate | 106-65-0 | 200 | 18 | | |
| tert-Butyl-n-m-xylene | 98-19-1 | 205 | n.s. | 0.015 | 0.36 |
| Benzyl alcohol | 100-51-6 | 205 | −15 | 0.013 | 0.30 |
| DBE (industrial mixture of dimethyl succinate and dimethyl glutarate) | "106-65-0" | 196–215 | n.s. | | |
| Dodecane | 112-40-3 | 215 | −12 | | |
| Diethyl succinate | 123-25-1 | 218 | −20 | | |
| Triglyme | 112-49-2 | 220 | −40 | | |
| Bicyclohexyl | 92-51-3 | 227 | 3 | 0.006 | 0.15 |
| Dimethyl adipate | 627-93-0 | 230 | 8 | | |
| 1-Decanol | 112-30-1 | 233 | n.s. | | |
| 2-Pyrrolidone | 616-45-5 | 245 | 25 | | |

The solvents listed in Table 2 do not make any claim to completeness. The preparation of a solution according to the invention is also readily possible for the person skilled in the art without inventive step with other solvents not explicitly mentioned here.

Preference is thus given to solutions according to the invention comprising, as solvent C, at least one solvent selected from methylcyclohexane, 3-pentanol, 1,4-dimethylcyclohexane, ethylene glycol monomethyl ether, 1,2-dimethylcyclohexane, octane, 2-hexanol, 1-pentanol, 1,2,4-trimethylcyclohexane, 4-heptanone, 3heptanone, 2-heptanone, nonane, cyclohexanone, 3-heptanol, 1-haxanol, 2-heptanol, diglyme, butyl butyrate, tert-butylbenzene, decane, 1-heptanol, 2-octanol, butylcyclohexane, 2-ethyl-1-hexanol, decalin, propylene glycol, dimethyl sulfoxide, 3,3,5-trimethylcyclohexanone, glycol, 3,7-dimethyl-1-octanol, 3,7-dimethyl-3-octanol, dimethyl succinate, tert-butyl-m-xylene, benzyl alcohol, DBE, dodecane, diethyl succinate, triglyme, bicyclohexyl, dimethyl adipate, 1-decanol or 2-pyrrolidone.

In order to explain the invention in greater detail, some readily usable solvent mixtures according to the invention are given in Table 3. This only represents a point of reference.

TABLE 3

Examples of solvent mixtures according to the invention

| Solvent A | Solvent C | Solvent B |
|---|---|---|
| o-Xylene | Butylcyclohexane | Veratrol |
| Anisole | Butylcyclohexane | Methyl benzoate |
| Anisole | Butylcyclohexane | 3,4-Dimethylanisole |
| Anisole | Decalin | Veratrol |
| Phenethol | Decalin | Veratrol |
| Methylanisole | Decalin | Veratrol |
| Anisole | Benzyl alcohol | Butyl benzoate |
| Anisole | Benzyl alcohol | Methylnaphthalene |
| Methylanisole | Benzyl alcohol | Butyl benzoate |
| Anisole | 3,7-Dimethyl-1-octanol | Veratrol |
| Phenethol | 3,7-Dimethyl-1-octanol | Ethyl benzoate |
| Methylanisole | 3,7-Dimethyl-1-octanol | Methylnaphthalene |
| Anisole | DBE | Ethyl benzoate |
| Phenethol | DBE | Methylnaphthalene |
| Methylanisole | DBE | Butyl benzoate |
| Anisole | t-Butyl-m-xylene | Veratrol |
| Phenethol | t-Butyl-m-xylene | Veratrol |
| Methylanisole | t-Butyl-m-xylene | Veratrol |
| Anisole | Bicyclohexyl | Propyl benzoate |
| Phenethol | Bicyclohexyl | Propyl benzoate |
| Methylanisole | Bicyclohexyl | Propyl benzoate |
| 2,5-Dimethylanisole | Bicyclohexyl | Propyl benzoate |

A particularly advantageous property of the solutions according to the invention is that they thicken and gel very rapidly on drying (concentration). This property is produced through a suitable choice of the solvents and the suitable relative boiling points or vapour pressures, as described above.

A gel is taken to mean a shape-stable, easily deformable, liquid-rich disperse system comprising at least 2 components, which usually consists of a solid substance having long or highly branched particles and a liquid as dispersion medium. Very rapid thickening in this connection means that the thickening and gelling takes place more rapidly than in accordance with simple physical laws. Thus, the following correlation generally exists between viscosity η and concentration c for polymer solutions:

$$\eta \sim c^{3.4}$$

This clearly means that if the concentration is doubled, the viscosity is increased by a factor of approximately ten. This is a theoretical value which, however, does not always occur in practice. Real polymer solutions change their viscosity by a factor in the range from about 5 to 10 on doubling of the concentration. From a certain point, the solution then gels, i.e. it becomes shape-stable and no longer completely flowable.

Very rapid thickening or gelling thus means that if the concentration is doubled, as during drying of a printed film or pixel, the viscosity increases by more than a factor of 10.

This effect can, surprisingly, be found in a particularly pronounced manner in a preferred embodiment in the solutions according to the invention (cf., for example, solutions 4 to 6 in Example 1.2, 7 to 9 in Example 2.2, 10 to 12 in Example 2.3). This very effect appears to be of particular importance in overcoming problems 2, 3, 4 and 6 described at the outset.

For the preparation of the solutions, the organic semiconductor of blend is dissolved in the desired concentration in the desired solvent mixture. It may also be appropriate firstly to dissolve the organic semiconductor or blend in some of the solvents, for example a mixture of solvents A and B, and then to add the remaining solvent(s), for example solvent C, to this solution. Since organic semiconductors and solutions thereof are in some cases not stable to oxygen or other air constituents, it may be appropriate to carry out this operation under an inert atmosphere, for example under nitrogen argon. It may also be appropriate to accelerate the dissolution process, for example by heating and/or stirring. Aggregates of the organic semiconductor or matrix polymer may also be comminuted here, for example by external mechanical action, for example by ultrasound, as described in WO 03/019694. The addition of further additives, as described, for example, in WO 03/01693, may likewise prove advantageous for the application. It has furthermore proven advantageous to filter the solutions before use in order to remove, for example, relatively small amounts of crosslinked constituents or dust particles from them.

The solutions described here exhibit surprising improvements in the above-mentioned problem areas.

Thus, the sue of solvents in the preferred boiling range results in the solutions not drying too quickly in the print head or on the nozzles (problem 1). Although even higher-boiling solvents offer further improvements here, these then have disproportionately great disadvantages, especially in the case of problems 3 to 5. It has proven very advantageous here to employ solvents in the boiling-point range described.

Significant improvement are also achieved in the case of problem 2. Thus, blend materials in films or pixels produced from solutions according to the invention exhibit absolutely no inhomogeneities in electroluminescence. Without wishing to be tied to a certain theory, we assume that the rapid thickening of the solution during drying substantially prevents separation of the blends, facilitating more homogeneous material distribution in the film. A considerable advance has been achieved for problem 3 by using ternary solvent mixtures having the described solubility properties and relative boiling points or vapour pressures. As described above, a very high viscosity is thereby achieved very rapidly in the pixel or film during evaporation, countering the formation of the inhomogeneous material distribution.

Problem 4 and problem 5 are solved significantly better than with higher-boiling solvents. In particular in the case of problem 4, the very rapid thickening of the solution has enabled particularly clear effects to be achieved.

During drying of the solutions according to the invention, the organic semiconductor does not precipitate out of the solution, and consequently problem 6 can hereby also be regarded as solved. Without wishing to be tied to the correctness of a certain theory, we assume that addition of a small proportion of a good solvent B which has a higher boiling point or lower vapour pressure (at the application temperature) than the poor solvent C can prevent a precipitate of the organic semiconductor during the drying process. This ha not hitherto been described in this way in the literature and surprisingly results in significantly more homogeneous films than is the case with binary or ternary solvent systems in which the organic semiconductor or other blend constituents has the lowest solubility in the highest-boiling solvent.

Problems 2 to 5 could in principle also be solved by the use of really low-boiling solvents (or solvent mixtures). However, these cause difficulties which are technically unsolvable for problem 1 and problem 6. Thus, in particular, solvent mixtures having different solubility properties and different boiling points are an optimum solution to these problem areas. Problems 1 to 6 in combination cannot be solved appropriately using a single solvent. If an excessively low-boiling solvent is used, problems 1 and 6 cannot be solved, while if an excessively high-boiling solvent is used, problems 3 to 5 are always more difficult to solve.

The present application text and also the examples following below are directed, in particular, to solutions according to the invention for the production polymeric light-emitting diodes and the corresponding displays. In spite of this restriction of the description, it is possible for the person skilled in the art, without further inventive step, also to use corresponding solutions according to the invention for the production of other organic electronic devices, for example for organic field-effect transistors (O-FETs), organic thin-film transistors (O-TFTs), organic integrated circuits (O-ICs), organic solar cells (O-SCs) or also organic laser diodes (O-lasers), to mention but a few applications.

The present invention thus furthermore relates to organic electronic devices preferably selected from the group polymeric light-emitting diodes (PLEDs), organic field-effect transistors (O-FETs), organic thin-film transistors (O-TFTs), organic integrated circuits (O-ICs), organic solar cells (O-SCs) and organic laser diodes (O-lasers), comprising at least one layer according to the invention obtained using a solution according to the invention and/or a process according to the invention.

The present invention is explained in greater detail by the following examples, without wishing to be restricted thereto. The person skilled in the art will be able to prepare further solutions according to the invention without inventive step from the description and the examples given and use these to produce layers therefrom.

EXAMPLES

Example 1

Solutions of Polymer POLY1 in Mixtures of anisole, 4-methylanisole (Each Solvent A), veratrol (Solvent B) and decalin (Solvent C):

1.1 Materials Employed:

Polymer POLY1 is a polymer in accordance with Example P17 in WO 02/077060, in accordance with the ordered variant in accordance with Example P1 from DE 10337077.3. The batch POLY1-B6 used here has an $M_w$ of 220 k g/mol, an $M_n$ of 70 k g/mol and an $M_p$ of 180 k g/mol. A solution comprising 14 g/l in anisole/o-xylene has a viscosity (at 500 s$^{-1}$) of about 6.6 mPas.

Sovents:

Anisole; boiling point 154° C.; solubility of POLY1-B6>30 g/l.

4-Methylanisole; boiling point 174° C.; solubility of POLY1-B6>30 g/l.

Veratrol: boiling point 207° C.; solubility of POLY1-B6>30 g/l.

Decalin (isomer mixture): boiling point 187° C.; solubility of POLY1-B6<0.05 g/l.

1.2 Solution Preparation and Basic Properties:

Various mixtures were prepared with the above-mentioned solvents and the said polymer. All solutions comprised about 11 g/l of the polymer. The solutions are specified in greater detail in Table 4:

TABLE 4

Compositions of various solutions

| Number | Anisole (% by vol) | Me-anisole (% by vol) | Veratrol (% by vol) | Decalin (% by vol) | According to the invention? | In accordance with the prior art? |
|---|---|---|---|---|---|---|
| Solution 1 | 50 | | 0 | 50 | NO | WO 02/069119 |
| Solution 2 | 0 | | 50 | 50 | NO | NO |
| Solution 3 | 40 | 10 | 0 | 50 | NO | WO 02/072714 |
| Solution 4 | 40 | 10 | | 50 | YES | NO |
| Solution 5 | 30 | 10 | | 60 | YES | NO |
| Solution 6 | 34 | 6 | | 60 | YES | NO |

The solutions were subsequently evaporated slowly and the behaviour of the solutions with respect to concentration/viscosity curve or other properties was followed. These results are summarized in Table 5.

TABLE 5

Behaviour of the solutions during concentration

| | Viscosity (@ 500 s$^{-1}$) | | | | |
|---|---|---|---|---|---|
| Number | 11 g/l | ~20 g/l | ~30 g/l | ~40 g/l | Comments |
| Solution 1 | 6.3 | 53.8 | n.s. | n.s. | Polymer precipitates at about 25 g/l |
| Solution 2 | 8.0 | 42.0 | 108 | 255 | No considerable thickening. |
| Solution 3 | 6.5 | 55.3 | n.s. | n.s. | Polymer precipitates at about 25 g/l |
| Solution 4 | 7.4 | 78.2 | 367 | 925 | Considerable thickening |
| Solution 5 | 7.4 | 249 | ~1200 | >5000 | Very considerable thickening |
| Solution 6 | 7.4 | 263 | ~1300 | >5000 | Very considerable thickening. |

The solutions in accordance with the prior art (solution 1 and solution 3; in each case the highest-boiling solvent has the lowest solubility for the polymer used) exhibit unusable behaviour for the application. The polymer precipitates. Reasonable film formation thus cannot be achieved.

Solution 2 does not exhibit any particular effects with respect to the thickening behaviour.

The solutions according to the invention exhibit clear effects with respect to the thickening behaviour.

1.3 Investigations with Respect to Printability and Film Formation:

The above-mentioned solution 6 was investigated in more detail with respect to its usability in IJ printing.

The solution exhibited a surface tension of about 31.5 dyn/cm.

The solution was printed through a Spectra SX-128 print head (Spectra, USA). The printing conditions were relatively easy to optimise.

The following results were obtained:

The drop mass exhibits a linear dependence on the voltage used in the suitable range (about 7 ng at 45 V, about 10ng at 50 V, about 13 ng at 55 V).

The drop velocity likewise exhibits a linear dependence on the voltage (about 3 m/s t 45 V, about 4 m/s at 50 V, about 5 m/s at 55 V).

The print head could be operated without problems in the range from about 1000 to virtually 10,000 Hertz.

Simple optimised printing conditions were the following: 50 V; pulse width 5 µs; printing frequency 1 kHz.

The drops exhibited short ligaments, which, however, were withdrawn back into the drops very rapidly; this occurred (on average) within the first 475 µm; i.e. printing with a separation 0.5 mm is possible without problems. In addition, no problems with satellite formation were again found.

Solution 6 was then printed with the optimised conditions into a structured substrate ($CF_4/O_2$ plasma-treated partitioning), where very good (homogeneous) film formation was achieved. This is shown into the two FIGS. 1 and 2 below. The individual pixels here had a size of about 66 µm×175 µm. 10 drops were dispensed per pixel from a distance of about 2 mm.

The following points were observed:

The printability of solution 6 proved to be very good. i.e. significantly more advantageous than the prior art.

Under optimised conditions, very homogeneous films were obtained.

1.4 Investigation with respect to use in the EC:

Solution 6 was investigated with respect to use in electroluminescence. For comparison, a solution in toluene was also measure in parallel as reference. The PLEDs were each produced by spin coating (a general method for this purpose is described, for example, in the above-mentioned WO 02/072714). Both solutions were treated with an NIR dryer during the spin coating since solution 6 in particular otherwise requires a very long time for drying (cf. also: WO 03/038923).

Both solutions gave (optically) very attractive homogeneous layers.

The EC evaluation is compared in Table 6:

TABLE 6

EC evaluation

| Solution | | Voltage [V] | | | | | | |
|---|---|---|---|---|---|---|---|---|
| | | 2.8 | 3.0 | 3.2 | 3.4 | 3.6 | 3.8 | 4.0 |
| # 6 | j [mA/cm²] | 0.97 | 2.93 | 6.43 | 11.8 | 19.1 | 28.8 | 41.4 |
| (acc. | L [cd/m²] | 48 | 158 | 352 | 639 | 1030 | 1500 | 2100 |
| to invention) | Eff. [cd/A] | 5.0 | 5.4 | 5.4 | 5.4 | 5.4 | 5.2 | 5.0 |
| In toluene | j [mA/cm²] | 0.20 | 0.52 | 1.1 | 1.9 | 3.2 | 5.0 | 8.6 |
| (reference) | L [cd/m²] | 3 | 23 | 52 | 100 | 168 | 264 | 469 |
| | Eff. [cd/A] | 1.5 | 4.6 | 4.7 | 5.2 | 5.3 | 5.3 | 5.4 |

The PLEDs from the two solutions exhibited the same colour (pale blue; CIE 1931 coordinates: X~0.18, Y~0.27).

Lifetime measurement showed that the device from solution 6 had approximately double the lifetime at comparable brightness (about 3000 h at 100 cd/m² compared with about 1500 h from the toluene solution).

In summary, the following surprising advantages were thus obtained:

The film formation is also very good from a simple coating method (spin coating).

The morphology of the layer produced is significantly different compared with the prior art. The PLEDs produced therewith exhibit significantly steeper current/ voltage characteristic lines (and thus also significantly greater brightness at the same voltage).

Surprisingly, the operating lifetime is also positively influenced thereby.

Example 2

Solutions of Polymer POLY1 in Mixtures of anisole, phenethol, 4-methylanisole (Each Solvent A), veratrol (Solvent B) and t-butyl-m-xylene (Solvent C):

2.1 Materials Employed:

Polymer POLY1 is the polymer already described in Example 1. The batch POLY1-B7 used here has an $M_w$ of 325 k g/mol, an $M_n$ of 100 k g/mol and an $M_p$ of 275 k g/mol. A solution comprising 14 g/l in anisole/o-xylene has a viscosity (at 500 s−1) of about 10.1 mPas.

Solvents:
Anisole; boiling point 154° C.; solubility of POLY1-B7>30 g/l.
Phenethol; boiling point 170° C.; solubility of POLY1-B7>30 g/l.
4-Methylanisole; boiling point 174° C.; solubility of POLY1-B7>30 g/l.
Veratrol: boiling point 207° C.; solubility of POLY1-B7>30 g/l.
t-Butyl-m-xylene: boiling point 205° C.; solubility of POLY1-B7<1 g/l.

2.2 Solution Preparation and Basic Properties:

Various mixtures were prepared with the above-mentioned solvents and the said polymer. All solutions comprised about 10 g/l of the polymer. The solutions are specified in greater detail in Table 7:

TABLE 7

Compositions of various solutions

| Number | Anisole (% by vol) | Phenethol (% by vol) | Me-anisole (% by vol) | Veratrol (% by vol) | t-Butyl-m-xylene (% by vol) |
|---|---|---|---|---|---|
| Solution 7 | 20 | | | 4 | 76 |
| Solution 8 | | 11 | | 4 | 85 |
| Solution 9 | | | 10 | 4 | 86 |

The solutions were subsequently evaporated slowly and the behaviour of the solutions with respect to concentration/viscosity curve or other properties was followed. These results are summarized in Table 8.

TABLE 8

Behaviour of the solutions during concentration

| | Viscosity (@ 40 s⁻¹) | | | | |
|---|---|---|---|---|---|
| Number | ~10 g/l | ~14 g/l | ~20 g/l | ~25 g/l | Comments |
| Solution 7 | 10.3 | 33.3 | 1026 | 2500 | Very considerable thickening |
| Solution 8 | 11.2 | 37.9 | 950 | 5000 | Very considerable thickening |
| Solution 9 | 11.2 | 46.3 | 897 | 3500 | Very considerable thickening |

As in Example 1, the solutions according to the invention exhibit clear effects with respect to the thickening behaviour.

Investigations with Respect to Printability and Film Formation:

Solutions 7 and 9 were investigated with respect to their printing properties.

The drop mass and drop velocity in each case had—as also in Example 1—a linear dependence on the voltage used.

The print head could be operated without problems in the range from about 1000 to (depending on the solution) 5000 or 7000 hertz.

Simple optimised printing conditions were the following: 65 V; pulse width 5 µs; printing frequency 1 kHz.

The drops exhibited short ligaments, which, however, were withdrawn back into the drops very rapidly; this occurred (on average) within the first 250 µm; i.e. printing with a separation from 0.5 mm is possible without problems.

Printing into substrates (analogously to the details in Example 1) gave homogeneous films at a printing separation of 1 mm.

Example 3

Solutions of Polymer POLY1 in Mixtures of anisole, 4-methylanisole, 2,5-dimethylanisole (Each Solvent A), propyl benzoate (Solvent B) and bicyclohexyl (Solvent C):

3.1 Materials Employed:

Polymer POLY1 is the polymer already described in Example 1. The batch POLY1-B7 used here was described in detail in Example 2.

Solvents:
Anisole; boiling point 154° C.; solubility of POLY1-B7>30 g/l.
4-Methylanisole; boiling point 174° C.; solubility of POLY1-B7>30 g/l.
2,5-Dimethylanisole; boiling point 190° C.; solubility of POLY1-B7>30 g/l.
Propyl benzoate: boiling point 231° C.; solubility of POLY1-B7>30 g/l.
Bicyclohexyl: boiling point 227° C.; solubility of POLY1-B7<0.1 g/l.

3.2 Solution Preparation and Basic Properties:

Various mixtures were prepared with the above-mentioned solvents and the said polymer. All solutions comprised about 10 g/l of the polymer. The solutions are specified in greater detail in Table 9:

TABLE 9

Compositions of various solutions

| Number | Anisole (vol %) | Me-anisole (vol %) | 2,5-Dimethyl-anisole (vol %) | Propyl benzoate (vol %) | Bi-cyclohexyl (vol %) |
|---|---|---|---|---|---|
| Solution 10 | 38 | | | 26 | 36 |
| Solution 11 | | 20 | | 33 | 47 |
| Solution 12 | | | 21 | 31 | 48 |

The solutions were subsequently evaporated slowly and the behaviour of the solutions with respect to concentration/viscosity curve or other properties was followed. These results are summarized in Table 10.

TABLE 10

Behaviour of the solutions during concentration

| Number | Viscosity (@ 40 s$^{-1}$) ~10 g/l | ~14 g/l | ~20 g/l | ~30 g/l | Comments |
|---|---|---|---|---|---|
| Solution 10 | 9.2 | 20.5 | 2050 | 10000 | Very considerable thickening |
| Solution 11 | 13.4 | 53.7 | 1550 | 9400 | Very considerable thickening |
| Solution 12 | 16.5 | 76.6 | 1260 | 12300 | Very considerable thickening |

As in Examples 1 and 2, the solutions according to the invention exhibit clear effects with respect to the thickening behaviour.

3.3 Investigations with Respect to Printability and Film Formation:

Solution 10 was investigated intensively with respect to its printing properties.

The drip mass and drop velocity in each case had—as also in Example 1—a linear dependence on the voltage used. The print head could be operated without problems in the range from about 1000 to 10,000 hertz.

Simple optimised printing conditions were the following: 60 V; pulse width 5 μs; printing frequency 1 kHz.

The drops exhibited short ligaments, which, however, were withdrawn back into the drops very rapidly; this occurred (on average) within the first 250 μm; i.e. printing with a separation from 0.5 mm is possible without problems.

The nozzle plate was not wetted by this ink (i.e. there were absolutely no signs of polymer deposits).

Printing into substrates (analogously to the details in Example 1) gave homogeneous films at a printing separation of 0.5 mm.

The invention claimed is:

1. Single-phase, liquid compositions (solutions) comprising
   at least one organic semiconductor which comprises at least one high-molecular-weight component,
   and at least one organic solvent A,
   and at least one organic solvent B,
   and at least one organic solvent C,
   wherein the boiling points of all solvents A, B and C are greater than 80° C. and the following applies to the boiling points (b.p.) of solvents A, B and C: b.p.(A)<b.p.(C)<b.p.(B), and/or to the respective partial vapour pressures (p) at the temperature of the coating methods of solvents A, B and C: p(A)>p(C)>p(B) and
   wherein the organic semiconductor is soluble in the pure solvent A or in the pure solvent B in a concentration of at least 5 g/l at room temperature and the solubility of the organic semiconductor in the pure solvent C at room temperature is less than 0.3 g/l.

2. Solutions according to claim 1, wherein the organic semiconductor is employed as pure component.

3. Solutions according to claim 1, wherein the organic semiconductor is employed as a mixture of two or more components.

4. Solutions according to claim 3, wherein the solution additionally comprises one or more organic non-conductors as matrix.

5. Solutions according to claim 4, which further comprises a semiconductor which is selected from the group consisting of low-molecular-weight, oligomeric, dendritic or polymeric organic and organometallic semiconductors and mixtures thereof.

6. Solutions according to claim 1, wherein the high-molecular-weight component has a molecular weight $M_w$ of greater than 50,000 g/mol.

7. Solutions according to claim 1, wherein the high molecular weight organic semiconductor are selected from the group consisting of substituted poly-p-arylenevinylenes (PAVs), polyfluorenes (PFs), polyspirobifluorenes (PSFs), poly-para-phenylenes (PPPs) or poly-para-biphenylenes, polydihydrophenanthrenes (PDHPs), cis- and trans-polyindenofluorenes (PIFs), polythiophenes (PTs), polypyridines (PPys), copolymers which contain structural units from two or more of the above-mentioned classes, generally conjugated polymers, polyvinylcarbazoles (PVKs), polytriarylamines and soluble polymers containing phosphorescent units, which are soluble in organic solvents and mixtures thereof.

8. Solutions according to claim 1, wherein the boiling point of all three solvents A, B and C is greater than 120° C.

9. Solutions according to claim 1, wherein the boiling point of all three solvents A, B and C is less than 300° C.

10. Solutions according to claim 1, wherein the difference between the boiling points of solvent A and solvent C is greater than 10 K.

11. Solutions according to claim 1, wherein the difference between the boiling points of solvent C and solvent B is greater than 10 K.

12. Solutions according to claim 1, wherein the proportion of solvent A is 10 to 80% by vol., the proportion of solvent B is 0.5 to 40% by vol. and the proportion of solvent C is 10 to 90% by vol.

13. Solutions according to claim 12, wherein the proportion of solvent A is 25 to 60% by vol., the proportion of solvent B is 2 to 20% by vol. and the proportion of solvent C is 30 to 70% by vol.

14. Solutions according to claim 1, wherein the solution comprises additional solvents.

15. Solutions according to claim 1, wherein solvents A and B used are selected from the group consisting of mono- or polysubstituted aromatic solvents, formic acid derivatives, N-alkylpyrrolidones or high-boiling ethers.

16. Solutions according to claim 15, wherein solvents A and B are one or more solvents selected from the group consisting of 3-fluorobenzotrifluoride, benzotrifluoride, dioxane, trifluoromethoxybenzene, 4-fluorobenzotrifluoride, 3-fluoropyridine, toluene, 2-fluorotoluene, 2-fluorobenzotrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene, m-xylene, o-xylene, 2,6-lutidine, 2-fluoro-m-xylene, 3-fluoro-o-xylene, 2-chlorobenzotrifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzodioxole, 4-methylanisole, 3-methylanisole, 4-fluoro-3-methylanisole, 1,2-dichlorobenzene, 2-fluorobenzonitrile, 4-fluoroveratrol, 2,6-dimethylanisole, aniline, 3-fluorobenzonitrile, 2,5-dimethylanisole, 2,4-dimethylanisole, benzonitrile, 3,5-dimethylanisole, N,N-dimethylaniline, 1-fluoro-3,5-dimethoxybenzene, phenyl acetate, N-methylaniline, methyl benzoate, N-methylpyrrolidone, 3,4-dimethylanisole, acetophenone, o-tolunitrile, 4-tert-butylanisole, veratrol, ethyl benzoate, N,N-diethylaniline, propyl benzoate, 1-methylnaphthalene, 3,5-dimethoxytoluene, butyl benzoate, 2-methylbiphenyl, dimethylnaphthalene, 2-phenylpyridine and 2,2'-bitolyl.

17. Solutions according to claim 1, wherein the solvent C is selected from the group consisting of straight-chain, branched or cyclic alkanes, terpenes, (cyclo)aliphatic alcohols, ketones, carboxylic acid esters or mono- or polysubstituted aromatic solvents which have substituents having 4 or more C atoms, alkoxy substituents having 4 or more C atoms, alcohols having more than 4 C atoms, glycols and ethers.

18. Solutions according to claim 17, wherein solvent C is selected from the group consisting of methylcyclohexane, 3-pentanol, 1,4-dimethylcyclohexane, ethylene glycol monomethyl ether, 1,2-dimethylcyclohexane, octane, 2-hexanol, 1-pentanol, 1,2,4-trimethylcyclohexane, 4-heptanone, 3-heptanone, 2-heptanone, nonane, cyclohexanone, 3-heptanol, 1-hexanol, 2-heptanol, diglyme, butyl butyrate, tert-butylbenzene, decane, 1-heptanol, 2-octanol, butylcyclohexane, 2-ethyl-l-hexanol, decalin, propylene glycol, dimethyl sulfoxide, 3,3,5-trimethylcyclohexanone, glycol, 3,7-dimethyl-l-octanol, 3,7-dimethyl-3-octanol, dimethyl succinate, tert-butyl-m-xylene, benzyl alcohol, DBE, dodecane, diethyl succinate, triglyme, bicyclohexyl, dimethyl adipate, 1-decanol and 2-pyrrolidone.

19. A process for the production of layers of the organic semiconductors on a substrate which comprises utilizing the solution according to claim 1.

20. Process for the production of organic semiconductor layers on a substrate, wherein the solution according to claim 1, is processed by means of a printing method.

21. Process according to claim 20, wherein the printing method is an ink-jet printing (IJP) method.

22. Solutions according to claim 1, wherein solvent C is selected from the group consisting of straight chain, branched or cyclic alkanes having seven or more C atoms, terpenes, (cyclo)aliphatic alcohols, ketones, carboxylic acid esters, mono- or polysubstituted aromatic solvents which have substituents selected from the group consisting of alkyl substituents having 4 or more C atoms, alkoxy substituents having 4 or more C atoms, alcohols having more than 4 C atoms, glycols and ethers.

23. Solutions according to claim 1, wherein the boiling points of all solvents A, B and C are greater than 100° C.

24. Solutions according to claim 1, wherein the boiling points of all solvents A, B and C are greater than 120° C.

* * * * *